(12) United States Patent
Shin

(10) Patent No.: US 9,018,702 B2
(45) Date of Patent: Apr. 28, 2015

(54) SEMICONDUCTOR DEVICE AND METHOD OF MANUFACTURING THE SAME

(71) Applicant: SK Hynix Inc., Icheon-si Gyeonggi-do (KR)

(72) Inventor: Wan Cheul Shin, Asan-si Chungcheongnam-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/474,363

(22) Filed: Sep. 2, 2014

(65) Prior Publication Data

US 2014/0370679 A1    Dec. 18, 2014

Related U.S. Application Data

(62) Division of application No. 13/567,123, filed on Aug. 6, 2012, now Pat. No. 8,853,777.

(30) Foreign Application Priority Data

Dec. 22, 2011 (KR) .......................... 10-2011-0139989

(51) Int. Cl.
*H01L 29/66* (2006.01)
*H01L 21/8238* (2006.01)
*H01L 21/265* (2006.01)
*H01L 29/10* (2006.01)
*H01L 21/762* (2006.01)
*H01L 21/768* (2006.01)

(52) U.S. Cl.
CPC .... *H01L 21/26586* (2013.01); *H01L 29/66659* (2013.01); *H01L 29/1083* (2013.01); *H01L 29/1087* (2013.01); *H01L 21/76224* (2013.01); *H01L 21/76879* (2013.01); *H01L 29/66477* (2013.01)

(58) Field of Classification Search
CPC ............ H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66
USPC ......... 438/136, 137, 156, 173, 192, 206, 212, 438/424, 427, 428, 591; 257/20, 194, 257/135–136, 213–413, 900, 902–903
See application file for complete search history.

(56) References Cited

U.S. PATENT DOCUMENTS 6,011,712 A * 1/2000 Lee ................................ 365/156

* cited by examiner

*Primary Examiner* — Chuong A Luu
*Assistant Examiner* — Moin Rahman
(74) *Attorney, Agent, or Firm* — William Park & Associates Ltd.

(57) ABSTRACT

A semiconductor device according an aspect of the present disclosure may include an isolation layer formed within a substrate and formed to define an active region, a junction formed in the active region, well regions formed under the isolation layer, and a plug embedded within the substrate between the junction and the well regions and formed extend to a greater depth than the well regions.

5 Claims, 2 Drawing Sheets

SEMICONDUCTOR DEVICE AND METHOD OF MANUFACTURING THE SAME

CROSS-REFERENCE TO RELATED APPLICATION

The present application claims priority under 35 U.S.C. 119(a) to Korean patent application number 10-2011-0139989 filed on Dec. 22, 2011, in the Korean Intellectual Property Office, which is incorporated herein by reference in its entirety set forth in full.

BACKGROUND

1. Field of the Invention

Example embodiments relate to a semiconductor device and a method of manufacturing the same and, more particularly, to a semiconductor device including well regions and a method of manufacturing the same.

2. Description of the Related Art

A non-volatile memory device includes a high voltage transistor for controlling a high voltage used in program and erase operations. For example, the high voltage transistor may be included in a page buffer, a high voltage switch, a block select switch, etc. Well regions are further included in the substrate of the non-volatile memory device so that the high voltage transistor has a high breakdown voltage.

A known non-volatile memory device includes well regions formed within a P type substrate. The well regions may have a triple well structure including a P type well and an N type well formed to surround the P type well, or may have a double well structure including a P type well and an N type well formed under the P type well.

In the double well structure, the P type well is formed to have the same width as the N type well without surrounding the N type well. Thus, the well regions of the double well structure have a relatively low impurity concentration as compared with the triple well structure. Accordingly, the depletion layers of the source/drain regions of a high voltage transistor and the depletion layers of the well regions may be merged with each other and then extended because they are close to each other. It results in a problem wherein the breakdown voltage of the high voltage transistor is lowered. If the breakdown voltage of the high voltage transistor is lowered, the characteristic of the memory device deteriorates because program and erase biases may not be normally controlled.

BRIEF SUMMARY

Example embodiments relate to a semiconductor device in which a high voltage transistor may have a high breakdown voltage and a method of manufacturing the same.

In accordance with an aspect of the present disclosure, there is provided a semiconductor device, including an isolation layer formed within a substrate and defining an active region, a junction formed in the active region, well regions formed under the isolation layer, and a plug embedded within the substrate between the junction and the well regions and formed to extend to a greater depth than the well regions.

In accordance with another aspect of the present disclosure, there is provided a semiconductor device, including an isolation layer formed within a substrate and defining an active region, a junction formed in the active region, well regions formed under the isolation layer, and an impurity region formed under the junction or formed between the isolation layer and the well regions.

In accordance with an aspect of the present disclosure, there is provided a method of manufacturing a semiconductor device, including forming well regions within the substrate, forming an isolation layer, defining an active region, within the substrate in which the well regions are formed, forming a junction in the active region, and forming a plug embedded within the substrate between the junction and the well regions and formed to extend a greater depth than the well regions.

In accordance with another aspect of the present disclosure, there is provided a method of manufacturing a semiconductor device, including forming well regions within a substrate, forming an isolation layer, which defines an active region, within the substrate in which the well regions are formed, forming a junction in the active region, and forming an impurity region under the junction or between the isolation layer and the well regions.

DESCRIPTION OF EMBODIMENTS

Hereinafter, some example embodiments of the present disclosure will be described in detail with reference to the accompanying drawings. Figures are provided to allow those having ordinary skill in the art to understand a scope of embodiments of the disclosure.

Figure 1:
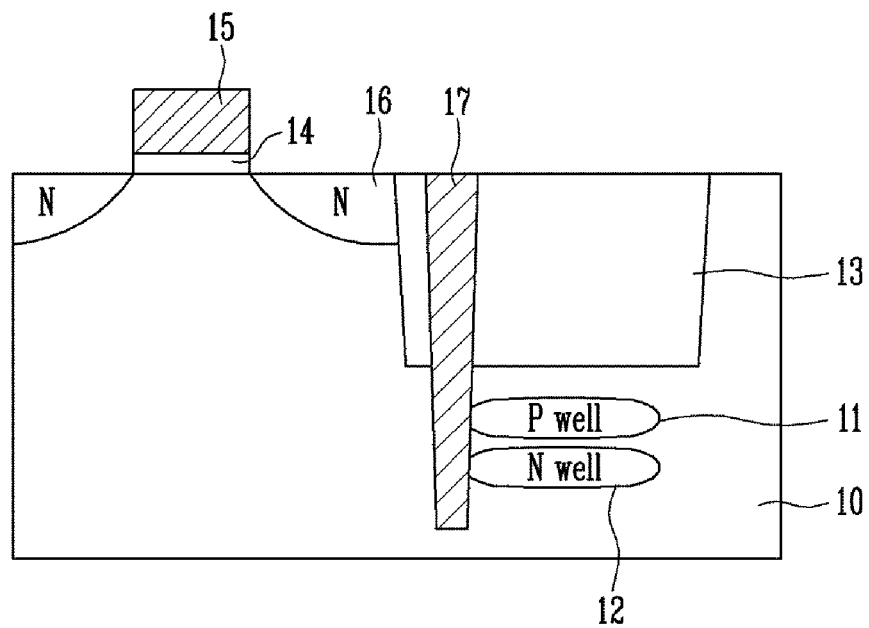
FIG. 1 is a cross-sectional view illustrating a structure of a semiconductor device and a method of manufacturing the semiconductor device according to a first embodiment of this disclosure.

FIG. 1 is a cross-sectional view illustrating a structure of a semiconductor device and a method of manufacturing the semiconductor device according to a first embodiment of this disclosure.

As shown in FIG. 1, the semiconductor device according to the first embodiment of this disclosure includes an isolation layer 13 formed within a substrate 10 and defines an active region, junctions 16 formed in the active region, well regions 11 and 12 formed under the isolation layer 13, and a plug 17 embedded within the substrate 10 between the junctions 16 and the well regions 11 and 12 and formed to extend to a greater depth than the well regions 11 and 12.

The well regions 11 and 12 may include the first well 11 and the second well 12, where the second well 12 may be placed under the first well 11. The first well 11 may be a P type well, and the second well 12 may be an N type well, where the second well 12 may have an opposite conductivity to the first well 11.

The junctions 16 may be an N type, and the junctions 16 may be source/drain regions of a high voltage transistor. For example, the semiconductor device may include a high voltage transistor, including a gate insulating layer 14 formed on the substrate 10 and a gate electrode 15 formed on the gate insulating layer 14. The junctions 16 formed within the substrate 10 on both sides of the gate electrode 15 may be used as the source/drain regions.

The plug 17 is formed to supplement the concentration of the well regions 11 and 12 and to form a depletion layer barrier between the junctions 16 and the well regions 11 and 12. The plug 17 is formed to penetrate the isolation layer 13 and may come in contact with the substrate 10 in which the well regions 11 and 12 are formed. An example in which the plug 17 is formed to come in contact with the well regions 11 and 12 has been described, but the plug 17 and the well regions 11 and 12 may be separated from each other, such that the plug 17 does not come in contact with the well regions 11 and 12.

The plug 17 is formed of a conductive layer having a P type. In this case, the concentration of the first well region 11 is supplemented because electrons within the substrate 10 around the plug 17 are combined with the holes of the plug 17. In particular, although the electrons (i.e., a majority carrier) of the second well 12 having an N type are diffused owing to a subsequent thermal treatment process, etc., the electrons of the second well 12 are recombined with the holes (i.e., a majority carrier) of the plug 17. Accordingly, the extension of the depletion layer due to the diffusion of electrons (i.e., a majority carrier) of the second well 12 can be prevented.

Furthermore, the plug 17 is formed to extend to a greater depth into the substrate 10 than the well regions 11 and 12 so that the plug 17 can sufficiently function as the depletion layer barrier. In particular, the plug 17 may be formed to extend to a greater depth than the second well 12. That is, the plug 17 may extend to a depth of the substrate 10 greater than the depth of the second well 12 in the substrate 10. Because there is a barrier (plug 17) between the junctions 16 and the depletions layers of the well regions 11 and 12, the junctions 16 and the well regions 11 and 12 may be prevented from extending and merging with into each other.

The plug 17 may be connected to a well pickup line (not shown). That is, the plug 17 may function as the depletion layer barrier and, at the same time, the plug 17 may be connected to the well pickup line and used as a well pickup. In this case, the characteristics of the semiconductor device can be improved by efficiently supplying a well bias voltage because the plug 17 is directly contacted to a well region.

A method of manufacturing the semiconductor device according to the first embodiment of this disclosure is described below.

A mask pattern (not shown) for ion implantation is formed on the substrate 10. The first well 11 of a P type and the second well 12 of an N type are formed by performing an ion implantation process using the mask pattern as a barrier. Thus, the well regions 11 and 12 can be formed by using the one mask pattern.

The substrate 10 is etched to form an isolation trench, and the isolation layer 13 is then formed by burying the isolation trench with an insulating layer.

A transistor including the gate insulating layer 14 and the gate electrode 15 are formed over the substrate 10. The junctions 16 (that is, the source/drain regions) of an N type are formed by implanting the ions of an impurity into the substrate 10 on both sides of the gate electrode 15.

A hole is formed by etching the isolation layer 13 and the substrate 10 between the junctions 16 and the well regions 11 and 12. Next, the plug 17 is formed by burying the hole with a conductive layer of a P type. Here, the plug 17 may be formed to have a greater depth than the second well 12 and may be formed at a depth of, for example, 10000 Å or less.

In some embodiments, the plug 17 may be formed before the well regions 11 and 12 are formed, or while the well regions 11 and 12 are formed. For example, if a retrograde well having an impurity concentration which increases as a well extends deeper into the substrate 10 is formed, a thermal treatment process is performed after implanting ions into the retrograde well. In the thermal treatment process, however, the impurity ions of the well regions 11 and 12 may not only be diffused in the depth direction, but may also be diffused in a horizontal direction. Accordingly, if the plug 17 is formed prior to the thermal treatment process for forming the retrograde well, the plug 17 prevents the impurity ions of the well regions 11 and 12 from laterally diffusing beyond the plug 17.

Figure 2:
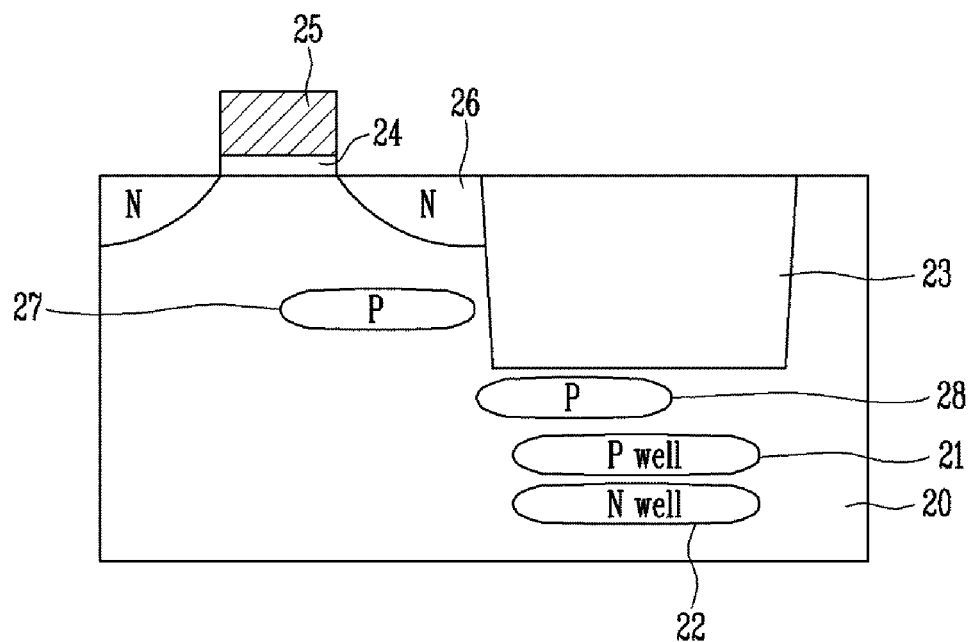
FIG. 2 is a cross-sectional view illustrating a structure of a semiconductor device and a method of manufacturing the semiconductor device according to a second embodiment of this disclosure.

FIG. 2 is a cross-sectional view illustrating a structure of a semiconductor device and a method of manufacturing the semiconductor device according to a second embodiment of this disclosure.

As shown in FIG. 2, the semiconductor device according to the second embodiment of this disclosure includes an isolation layer 23 formed within a substrate 20 and defining an active region, junctions 26 formed in the active region, well regions 21 and 22 formed under the isolation layer 23, a first impurity region 27 formed under the junctions 26, and a second impurity region 28 formed between the isolation layer 23 and the well regions 21 and 22.

The well regions 21 and 22 may include a first well 21 and a second well 22, where the second well 22 may be placed under the first well 21. The first well 21 may have a P type, and the second well 22 may have an N type having opposite conductivity to the first well 21.

The junctions 26 may have an N type, and the junctions 26 may be the source/drain regions of a high voltage transistor. For example, the semiconductor device may include a high voltage transistor, including a gate insulating layer 24 formed on the substrate 10 and a gate electrode 25 formed on the gate insulating layer 24. The junctions 26 may be formed within the substrate 10 on both sides of the gate electrode 25. The junctions 26 may be used as the source/drain regions.

The first impurity region 27 and the second impurity region 28 are formed to form a depletion layer barrier between the junctions 26 and the well regions 21 and 22. The first impurity region 27 is spaced apart from the junctions 26 and is formed under the junctions 26. The second impurity region 28 may be spaced apart from the first well 21 or may be formed to come in contact with the first well 21.

The first impurity region 27 and the second impurity region 28 have a P type. When an impurity region is additionally formed between the junctions 26 and the well regions 21 and 22 as described above, the concentration of the well region can be supplemented. That is, there is an effect that the concentration of the well region is increased. Accordingly, the depletion layers of the junctions 26 may be prevented from extending to and merging with the depletion layers of the well regions 21 and 22.

An example in which both the first and the second impurity regions 27 and 28 are included has been described in connection with the second embodiment, but any one of the first and the second impurity regions 27 and 28 may be included or excluded. Furthermore, the plug 17 of the first embodiment may be included in the semiconductor device of the second embodiment.

A method of manufacturing the semiconductor device according to the second embodiment of this disclosure is described below.

A mask pattern (not shown) for ion implantation is formed on the substrate 20. The first well 21 of a P type and the second well 22 of an N type are formed by performing an ion implantation process using the mask pattern as a barrier. Thus, the well regions 21 and 22 can be formed by using the one mask pattern.

After a trench is formed by etching the substrate 20, an ion implantation process for forming the first and the second impurity regions 27 and 28 on the inner wall or at the bottom of the trench is performed. Here, the trench may be an isolation trench for forming the isolation layer 23.

For example, after an isolation trench is formed by etching the substrate 20, the second impurity region 28 may be formed at the bottom of or underneath the isolation trench by vertically performing an ion implantation process. Next, impurity ions are implanted into the inner wall of the isolation trench by performing a tilt ion implantation process so that the impurity ions are implanted at a specific angle, thereby forming the first impurity region 27 under the junctions 26. Alternatively, after the first impurity region 27 is formed by the tilt ion implantation process, the second impurity region 28 may be formed by the vertical ion implantation process.

In one example, a first trench is formed by etching the substrate 20. The first trench may have a depth of 1500 to 2500 Å. Impurity ions are implanted into the bottom of the first trench by performing a vertical ion implantation process, thereby forming the second impurity region 28. Here, the projection range Rp of the vertical ion implantation process may be 1500 to 2500 Å. A second trench is formed by etching the bottom of the first trench. The second trench is for an isolation trench for forming the isolation layer 23. In this case, the etching depth of the second trench is controlled so that the second trench has a total depth of 3500 to 4500 Å. Impurity ions are implanted into the inner wall of the second trench by using a tilt ion implantation process, thereby forming the first impurity region 27 under the junctions 26. Here, the projection range Rp of the tilt ion implantation process may be 1500 to 2500 Å. Alternatively, after the first trench and the first impurity region 27 are formed, the second trench and the second impurity region 28 may be formed.

The isolation layer 23 is formed by burying the isolation trench with an insulating layer. A transistor including the gate insulating layer 24 and the gate electrode 25 is formed on the substrate 20. Impurity ions are implanted into the substrate 20 on both sides of the gate electrode 25, thereby forming the junctions 26 (that is, the source/drain regions) having an N type.

In accordance with the first and the second embodiments of this disclosure, the depletion barrier layer can be formed between the junctions 16 or 26 and the well regions 11 and 12 or 21 and 22. Accordingly, since the depletion layers of the junctions 16 or 26 is spaced apart from the depletion layers of the well regions 11 and 12 or 21 and 22 at a specific interval, the high voltage transistor can have a high breakdown voltage.

Figure 3:
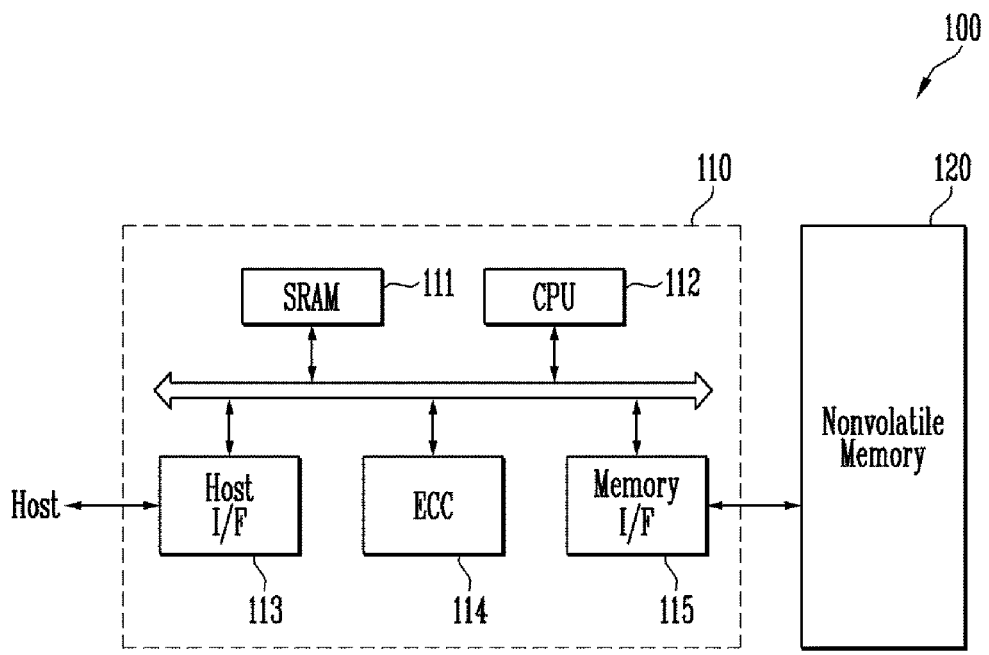
FIG. 3 shows a construction of a memory system according to an embodiment of this disclosure.

FIG. 3 shows a construction of a memory system according to an embodiment of this disclosure.

As shown in FIG. 3, the memory system 100 according to an embodiment of this disclosure includes a non-volatile memory device 120 and a memory controller 110.

The non-volatile memory device 120 is configured to include the structure described in connection with the first or second embodiment. In some embodiments, the non-volatile memory device 120 may be a multi-chip package including a plurality of flash memory chips.

The memory controller 110 controls the non-volatile memory device 120 and may include SRAM 111, a Central Processing Unit (CPU) 112, a host interface (I/F) 113, an ECC 114, and a memory I/F 115. The SRAM 111 is used as the operating memory of the CPU 112. The CPU 112 performs an overall control operation for the data exchange of the memory controller 110. The host I/F 113 is equipped with a data exchange protocol of a host coupled to the memory system 100. Furthermore, the ECC 114 detects and corrects errors included in data read out from the non-volatile memory device 120. The memory I/F 115 performs as interface for the non-volatile memory device 120. The memory controller 110 may further include an RCM for storing code data for an interface with the host.

The memory system 100 constructed as described above may be a memory card or a Solid State Disk (SSD) in which the non-volatile memory device 120 and the controller 110 are combined. For example, if the memory system 100 is an SSD, the memory controller 110 may communicate with the outside (e.g., a host) through various interface protocols, such as USB, MMC, PCI-E, SATA, PATA, SCSI, ESDI, and IDE.

Figure 4:
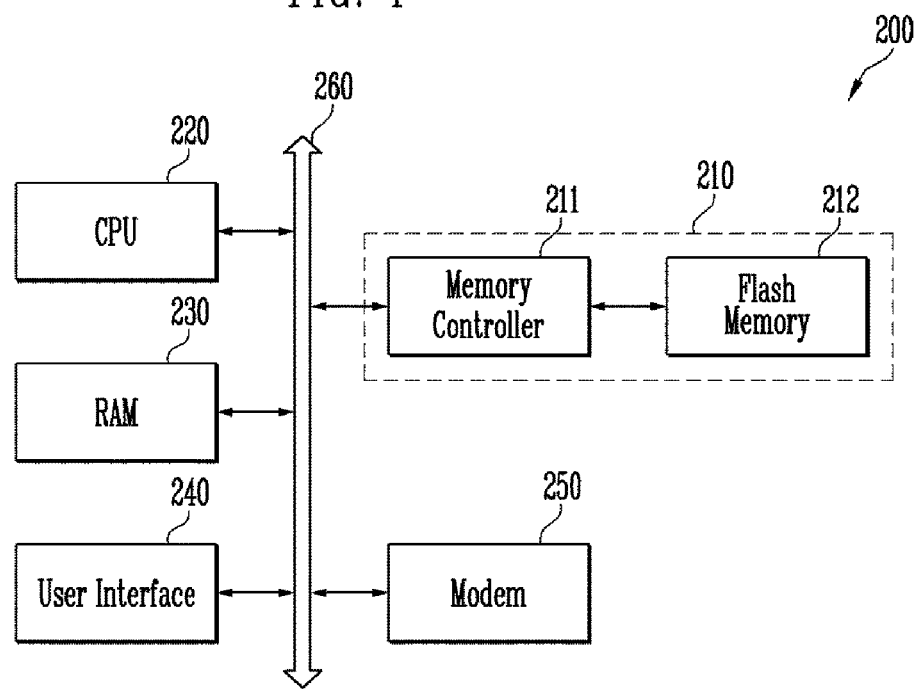
FIG. 4 shows a construction of a computing system according to an embodiment of this disclosure.

FIG. 4 shows a construction of a computing system according to an embodiment of this disclosure.

As shown in FIG. 4, the computing system 200 according to an embodiment of this disclosure may include a CPU 220, RAM 230, a user interface 240, a modem 250, and a memory system 210 each electrically coupled to a system bus 260. If the computing system 200 is a mobile device, the computing system 200 may further include a battery for supplying operating voltages to the computing system 200. The computing system 200 may further include application chipsets, a Camera Image Processor (CIS), mobile DRAM, and so on.

The memory system 210 may include a non-volatile memory device 212 and a memory controller 211, such as those described above with reference to FIG. 3.

In the semiconductor devices according to embodiments of this disclosure, the depletion layers of the junctions and the depletion layers of the well regions are spaced apart from each other at a specific interval because a depletion layer barrier is formed between the junctions and the well region. Accordingly, a high voltage transistor may have a high breakdown voltage.

What is claimed is:

1. A method of manufacturing a semiconductor device, comprising:
    forming well regions within a substrate;
    forming an isolation layer, defining an active region, within the substrate in which the well regions are formed;
    forming a junction in the active region; and
    forming a plug embedded within the substrate between the junction and the well regions and formed to extend to a greater depth than the well regions so that the plug compensates a concentration of the well regions and forms a depletion layer barrier between the junction and the well regions, wherein the plug is formed of a conductive layer having a P type.

2. The method of claim 1, further comprising forming an impurity region under the junction or between the isolation layer and the well regions.

3. The method of claim 1, wherein forming the plug comprises:
    forming a hole that extends to a greater depth than the well regions by etching the isolation layer and the substrate between the junction and the well regions; and
    forming the plug by burying the hole with a conductive layer.

4. The method of claim 1, wherein the junction is a source or drain region of a high voltage transistor.

5. The method of claim 1, wherein the plug is coupled to a well pickup line.

* * * * *